(12) United States Patent
D'Angelo

(10) Patent No.: US 11,265,004 B2
(45) Date of Patent: Mar. 1, 2022

(54) ANALOG-TO-DIGITAL CONVERTER CIRCUIT, CORRESPONDING DEVICE AND METHOD

(71) Applicant: STMicroelectronics S.r.l., Agrate Brianza (IT)

(72) Inventor: Giuseppe D'Angelo, Tufino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 192 days.

(21) Appl. No.: 16/667,419

(22) Filed: Oct. 29, 2019

(65) Prior Publication Data

US 2020/0153447 A1 May 14, 2020

(30) Foreign Application Priority Data

Nov. 9, 2018 (IT) .......................... 102018000010211

(51) Int. Cl.
*H03M 1/10* (2006.01)
*H03M 1/06* (2006.01)
*H02P 6/14* (2016.01)

(52) U.S. Cl.
CPC ............ *H03M 1/0687* (2013.01); *H02P 6/14* (2013.01); *H03M 1/1071* (2013.01)

(58) Field of Classification Search
CPC ..... H02P 6/14; H03M 1/0687; H03M 1/1071; H03M 1/1076; H03M 1/12
See application file for complete search history.

(56) References Cited

U.S. PATENT DOCUMENTS

2006/0190792 A1* 8/2006 Arnold ........... G01R 31/318555
714/736
2012/0206282 A1* 8/2012 Gorbold ............. G01R 31/3167
341/120
2014/0145696 A1* 5/2014 Hoshino ............... H02M 3/157
323/283
2015/0311852 A1* 10/2015 Urata ...................... H03M 3/30
318/400.2
2016/0182075 A1* 6/2016 Devarajan ............. H03M 1/128
341/120

(Continued)

FOREIGN PATENT DOCUMENTS

WO 0044099 A1 7/2000

OTHER PUBLICATIONS https://www.st.com/content/ccc/resource/technical/document/reference_manual/31/7e/97/ed/a6/dc/4e/2d/DM00071188.pdf/files/DM00071188.pdf/jcr:content/translations/en.DM00071188.pdf, "SPC56XL70xx 32-bit MCU family built on the embedded Power Architecture®," RM0342, Reference Manual, Oct. 2013, Doc ID 023986 Rev 3, 1388 pages.

(Continued)

*Primary Examiner* — Muhammad S Islam
(74) *Attorney, Agent, or Firm* — Slater Matsil, LLP

(57) ABSTRACT

In an embodiment, a circuit includes first and second analog-to-digital conversion circuit path. The first analog-to-digital conversion circuit path is configured to provide first converted digital data from an analog input signal. The second analog-to-digital conversion circuit path is configured to provide second converted digital data from the analog input signal. A comparison circuit is configured to compare the first converted digital data with the second converter digital data and generate a fault based on the comparison to reveal a mismatch between the first and second converted digital data.

21 Claims, 2 Drawing Sheets

(56) References Cited

U.S. PATENT DOCUMENTS

2017/0019120 A1     1/2017   Mallett
2018/0321305 A1    11/2018   Stafford et al.

OTHER PUBLICATIONS https://www.st.com/content/ccc/resource/technical/document/application_note/7e/8e/b4/f7/22/c8/41/af/DM00077858.pdf/files/DM00077858.pdf/jcr:content/translations/en.DM00077858.pdf, "Safety application guide for SPC56xL70xx/RPC56xL70xx family," AN4266, Application Note, May 2016, Doc ID 024283 Rev 3, 76 pages.

* cited by examiner

ANALOG-TO-DIGITAL CONVERTER CIRCUIT, CORRESPONDING DEVICE AND METHOD

CROSS-REFERENCE TO RELATED APPLICATIONS

This application priority to Italian Application No. 102018000010211, filed on Nov. 9, 2018, which application is hereby incorporated herein by reference.

TECHNICAL FIELD

The present disclosure relates generally to an electronic system and method, and, in particular embodiments, to an analog-to-digital converter (ADC) circuit, corresponding device and method.

BACKGROUND

Electric motors such as direct current (DC) motors are now commonly used in automotive applications such as fan, pump or actuator applications. A growing trend also exists to replace conventional DC motors with brushless DC (BLDC) motors.

In most automotive applications, detection of fault conditions of a BLDC motor and the associated control electronics is a highly desirable feature. A task of control electronics is to identify fault conditions and apply countermeasures to protect the system. A detected fault condition can be reported to the system microcontroller and made accessible via a vehicle diagnosis interface for further service and/or investigations.

SUMMARY

Despite the extensive activity, further improved solutions are desirable in the area discussed in the foregoing. Embodiments contribute in providing an improved solution.

The description relates to failure detection in analog-to-digital converters.

One or more embodiments may apply, for instance, in analog-to-digital converters (ADC's) used to sample signals that may be relevant for safety purposes, and may facilitate improving the safety level of an application.

According to one or more embodiments, a circuit having the features set forth in the claims that follow is used.

One or more embodiments may relate to a corresponding device. A control device for an electric motor such as a BLDC motor may be exemplary of such a device.

One or more embodiments may relate to a corresponding method.

The claims are an integral part of the technical teaching provided herein in respect of the embodiments.

One or more embodiments can be used in applications using one or more analog-to-digital converters (ADC's) used to sample signals that may be relevant for safety purposes, and may facilitate improving the safety level of an application, for instance in three-phase electric motor control applications in the automotive field.

It will be otherwise appreciated that, while extensively referred to throughout this description for ease of explanation and understanding, use of embodiments is in no way limited to electric motors and/or the automotive field. One or more embodiments may facilitate detecting transient faults which may affect analog-to-digital converters in a wide variety of applications, while avoiding the recourse to extensive redundant hardware and/or oversampling.

It is noted that redundant hardware and/or oversampling may have a negative impact on device size, computational load and detection delay, and may limit performance in terms of converter bandwidth, for instance.

One or more embodiments may facilitate detecting transient faults which may affect analog-to-digital converters.

One or more embodiments may provide a diagnostic coverage extended in comparison with certain prior art solutions with just a moderate increase (for instance up to 15-20%) in terms of device size and, possibly, cost, without appreciable impact on converter bandwidth, computational load and detection delay.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

Figure 1:
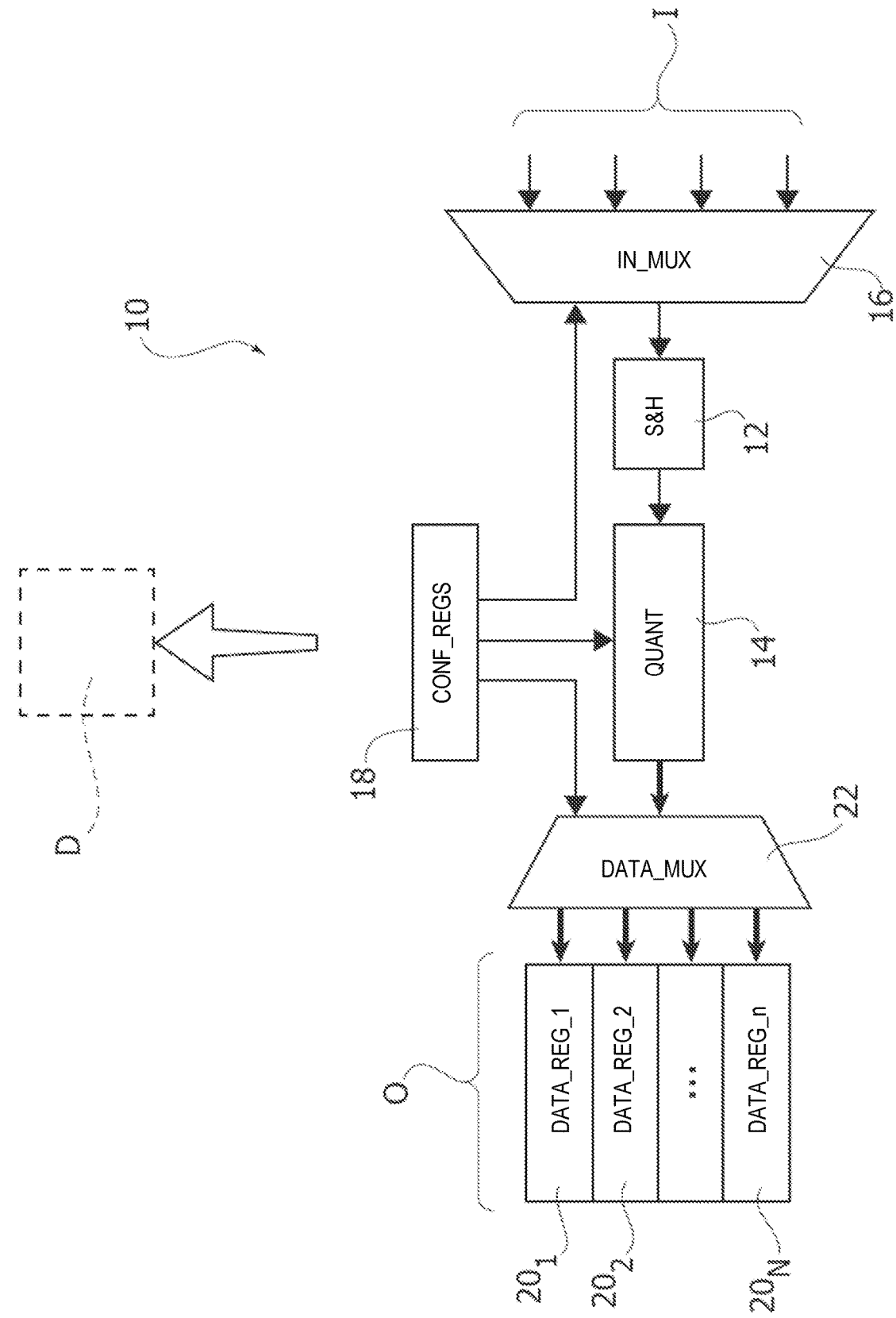
FIG. 1 is an exemplary block diagram of an analog-to-digital converter (ADC)

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment.

Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

Table 1 that follows is exemplary of failure modes/faults that may affect an analog-to-digital converter (ADC) as included, for instance, in control electronics in an advanced automotive application. As noted, referring to this exemplary area of application is merely for ease of explanation and understanding, and is not to be construed, even indirectly, in a limiting sense of the embodiments.

TABLE 1

Exemplary ADC hardware failures

| Failure modes | Fault type (transient or permanent) |
|---|---|
| Input signals | |
| Short circuit to GND | Permanent |
| Short circuit to VDD | Permanent |
| Open load | Permanent |

TABLE 1-continued

Exemplary ADC hardware failures

| Failure modes | Fault type (transient or permanent) |
|---|---|
| ADC Engine | |
| ADC locked | Permanent |
| ADC deviation (time/value) | Transient/Permanent |
| ADC data register corrupted | Transient/Permanent |
| ADC configuration corrupted/wrong | Transient/Permanent |
| ADC VREF corrupted/wrong | Permanent |
| ADC wrong channel selection | Transient/Permanent |
| ADC multiplexer failure | Permanent |
| ADC capacitor drifts/oscillation | Permanent |

Various methods have been proposed to address these failures.

For instance, the document STMicroelectronics AN4266—Safety application guide for SPC56xL70xx family (see, e.g., https://www.st.com/content/ccc/resource/technical/document/application_note/7e/8e/b4/f7/22/c8/41/af/DM00077858.pdf/files/DM00077858.pdf/jcr:content/translations/en.DM00077858.pdf) discloses two approaches. A first approach based on single-read analog inputs, where each analog input signal is assumed to be over-sampled sequentially using one ADC with a comparison of the results performed via application software. A second approach is based on double-read analog inputs, where each analog input signal is assumed to be sampled at the same time redundantly using two ADCs with a comparison of the results performed via application software.

Also, the document STMicroelectronics RM0342-SPC56XL70xx Reference Manual (available at www.st.com/content/ccc/resource/technical/document/reference_manual/31/7e/97/ed/a6/dc/4e/2d/DM00071188.pdf/files/DM0007188.pdf/jcr:content/translations/en.DM00071188.pdf) provides further details on ADC self-test features which may be useful for detecting permanent failures.

These approaches facilitate applying various hardware-assisted tests, namely:

a supply self-test, where three different reference voltages are sampled and these test conversions represent a sort of "atomic" operation (no functional conversions interleaved). Internal watchdog features, pre-configured by software, are used to compare the sampled values with the expected ones;
 a resistive-capacitive self-test: nineteen test conversions are performed by setting the internal resistive digital-to-analog converter (DAC) in the ADC. Internal watchdog features pre-configured by software are again used to compare the sampled values with the expected ones;
 a capacitive self-test: seventeen test conversions are performed by setting the capacitive elements comprising the sampling capacitor and the internal capacitive DAC in the ADC. Once again, internal watchdog features pre-configured by software are used to compare the sampled values with the expected ones;
 a first redundancy code test designated ADC_SW-TEST_REGCRC, where a cyclical redundant code (CRC) checksum of ADC configuration registers values is computed and compared with an expected one;
 a second redundancy code test designated SIUL_SW-TEST_REGCRCm, where a further CRC checksum of ADC configuration registers values is computed and compared with an expected one.

If the former approach is adopted, two further pairs of tests can be effected:

in a test designated ADC_SWTEST_TEST1, a built-in self-test (BIST) software exploits a pre-sampling feature of the ADC. Pre-sampling allows to pre-charge or discharge an ADC internal capacitor before it starts the sampling and conversion phases of the analog input coming from pads. During the pre-sampling phase, the ADC samples an internally-generated voltage while in the sampling phase the ADC samples analog input coming from pads. If an open circuit failure occurs in the analog multiplexing circuitry, the signal converted by the ADC is not the analog input coming from the pad, but the pre-sampling reference voltage (VDD or VSS). This BIST is run for each analog input used by the safety function. Since the pads dedicated to analog inputs are of type INPUT, a missing enable from the System Integration Unit Lite (SIUL—an IP which controls the pads in a SPC56XL70xx microcontroller) results in an open failure;
 in a further test designated ADC_SWTEST_TEST2 a software BIST exploits a pre-sampling feature of the ADC. Pre-sampling is configured in such a way that sampling of the channel is bypassed and pre-sampling reference supply voltages are converted. During the first step the VDD voltage is converted and compared with its expected value. Then a VSS voltage is converted and compared with its expected value. If these values are different from the expected ones, a short circuit failure on the multiplexed circuitry is declared;
 in a test designated ADC_SWTEST_VALCHK, ADC data registers having some fields indicating the number of the converted channels and conversion type (for instance normal or injected) are checked. A SW test reads and verifies these fields after every acquisition;
 in a test designated ADC_SWTEST_OVERSAMPLING, redundant-in-time conversions are performed for each signal. In the test, signals are sampled at a rate significantly higher than the Nyquist frequency related to the signal. The test compares the acquired values to verify a correlation: in fact, in case of fault the acquired values are not correlated with themselves. For random faults, at least three consecutive conversions are involved for each acquisition.

If the latter approach is adopted, in a further SW test designated ADC_SWTEST_CMP, the double-acquired values are compared, in a comparison which involves a certain approximation in order to take into account conversion differences.

Table 2 which follows is a synopsis of the HW-assisted and SW tests (safety mechanisms) discussed in the foregoing, and the relevant execution frequency.

Basically, the HW-assisted tests can be executed after boot or once for each Fault Tolerant Time Interval (FTTI, that is the time-span in which a fault or faults can be present in a system before a hazardous event occurs) and these are basically able to detect permanent faults affecting the ADC.

On the contrary, SW tests are executed for each conversion and these are able to detect temporary (transient or intermittent) faults affecting the result of a specific analog-to-digital conversion.

TABLE 2

Exemplary ADCs hardware failures

| Safety mechanism | Test type | Frequency Single Read Analog Inputs | Frequency Double Read Analog Inputs |
|---|---|---|---|
| SUPPLY SELF-TEST | HW-assisted | Once in the FTTI | Once after boot |
| RESISTIVE-CAPACITIVE SELF-TEST | HW-assisted | Once in the FTTI | Once after boot |
| CAPACITIVE SELF-TEST | HW-assisted | Once in the FTTI | Once after boot |
| ADC_SWTEST_TEST1 | HW-assisted | Once in the FTTI | Not applicable |
| ADC_SWTEST_TEST2 | HW-assisted | Once in the FTTI | Not applicable |
| ADC_SWTEST_REGCRC | HW-assisted | Once in the FTTI | Once after programming |
| SIUL_SWTEST_REGCRC | HW-assisted | Once in the FTTI | Once after programming |
| ADC_SWTEST_VALCHK | SW | Once for every conversion | Not applicable |
| ADC_SWTEST_OVERSAMPLING | SW | Once for every conversion | Not applicable |
| ADC_SWTEST_CMP | SW | Not applicable | Once for each conversion |

Semiconductor failure rate is generally reported as failure in time (FIT), where one FIT is one failure in 1 billion operating hours. Industry standards such as IEC/TR 62380 provide a mathematical model to estimate permanent FIT (package and silicon) based on the complexity of a component and the usage conditions such as temperature and power on/off hours.

No industry-standardized method currently exists to estimate the transient FIT. Ideally, estimation can be based on data from experiments using test chips of the appropriate process technology, as described in the not-industry-standard SN29500.

It is noted that silicon transient FIT can be one to three orders of magnitude higher than the silicon permanent FIT.

For instance, a ratio of about three orders of magnitude for RAW FIT and two orders of magnitude for residual FIT (that is the number of faults not detected by implemented safety mechanisms) can be observed in certain automotive microcontrollers. Moreover, most of the residual FIT is due to transient faults.

System developers perform hazard analysis and risk assessment in order to evaluate the risk reduction level aimed at for a functional safety end-product system application. The outcome of the assessment is a safety goal, for instance a classification of safety integrity level (SIL) 1 to 4 as described in IEC 61508 or automotive safety integrity level (ASIL) A to D in ISO 262626.

The standards define metrics that evaluate both the coverage of architectural safety mechanisms that reduce the risk for various types of faults and the probabilities of faults occurring, and then use these metrics for measuring attainment of safety goals.

Metrics such as SPFM (single point fault metric), LFM (latent fault metric) and SFF (safe failure fraction) are ratio metrics showing architectural effectiveness of failure rate reduction. Also PMHF (probabilistic metric for random hardware failures) and PFH (probability of failure per hour) are probabilistic metrics showing overall reduced risk level.

Table 3 that follows shows ASIL specifications for single point fault metric (SPFM), latent fault metric (LFM), and probabilistic metric for random hardware failures (PMHF).

TABLE 3

ASIL metric specifications

| ASIL | SPFM | PMHF (FIT) | LFM |
|---|---|---|---|
| ASIL B | >90% | <100 | >60% |
| ASIL C | >97% | <100 | >80% |
| ASIL D | >99% | <10 | >90% |

According to this table, in order to reach an automotive safety integrity level (ASIL), safety mechanisms are desirable for system and subsystem developers capable of detecting at least a fixed percentage of the FIT (for instance for ASIL D devices, SPFM>99.0% and LFM>90.0%) but also to reduce the absolute number of residual FIT (for instance for ASIL D devices, PMHF<10). As result, system developers mainly focus on the detection of transient faults.

In certain implementations of the former method discussed in the foregoing, three samples are acquired for each sampled analog input signal (ADC_SWTEST_OVERSAMPLING test) and the comparison is entrusted to a software feature. For each conversion, that feature checks some additional values (ADC_SWTEST_VALCHK). As a result, the total conversion time for each sampled analog input signal may be affected appreciably, so that the available converter bandwidth is significantly reduced.

Moreover, in the exemplary case considered, the comparison is entrusted to software, and a certain computational load results. Also, detection of a failure may not be immediate insofar as detection depends on latency and execution time of the dedicated software routine. On the other hand, implementing such a method with its relevant safety mechanisms does not affect device size: this is however to be weighed against other factors affecting converter bandwidth, computational load and detection delay.

In certain implementations of the latter method discussed in the foregoing, in order to exploit redundancy and to decrease the probability of CCFs (Common Cause Faults), the ADC hardware and the redundant hardware are configured to belong to independent modules and comparison is again entrusted to a software feature, with an increased computational load. Again, detection of a failure may not be immediate insofar as detection depends on latency and the execution time of the dedicated software routine. Implementing this method with its relevant safety mechanisms does not affect converter bandwidth, but has an impact on device size, cost, computational load and detection delay.

One or more embodiments facilitate detecting transient faults which may affect an analog-to-digital converter with a reduced impact on device size and cost, and no appreciable effects on converter bandwidth, computational load and detection delay.

FIG. 1 is an exemplary block diagram of an analog-to-digital converter (ADC) circuit 10.

Operation of such a circuit involves two processes: sampling and quantization.

The sampling process, performed in a sample-and-hold (S&H) circuit block 12, samples (captures) a continuously varying analog signal and holds (freezes) its value at a constant level for a certain (minimum) time.

The quantization process, performed in a quantization circuit block 14 converts the sampled value in an element of a finite set of discrete values.

In the exemplary block diagram of FIG. 1 a first multiplexer circuit block 16 is provided to select the input signal I to be converted, that is the ADC channel.

In the exemplary block diagram of FIG. 1, such type of operation is controlled by a set of ADC configuration registers 18 comprising, for each ADC channel, an ADC data register $20_1, 20_2, \ldots, 20_N$ where N is the total number of ADC channels available to store the converted values (which represent the output O from the ADC converter 10) and selected through a second multiplexer circuit block 22 under the control of the ADC configuration registers 18.

The output O from the ADC converter 10 may be supplied to a "user" device D (shown in dashed lines) in respect of which the ADC converter 10 may be either a distinct, separate element or a component incorporated therein. A controller of an electric motor such as a DC motor (a controller of a BLDC motor, for instance, may be exemplary of such a device).

This basic circuit layout can be regarded as conventional in the art, which makes it unnecessary to provide a more detailed description herein.

Figure 2:
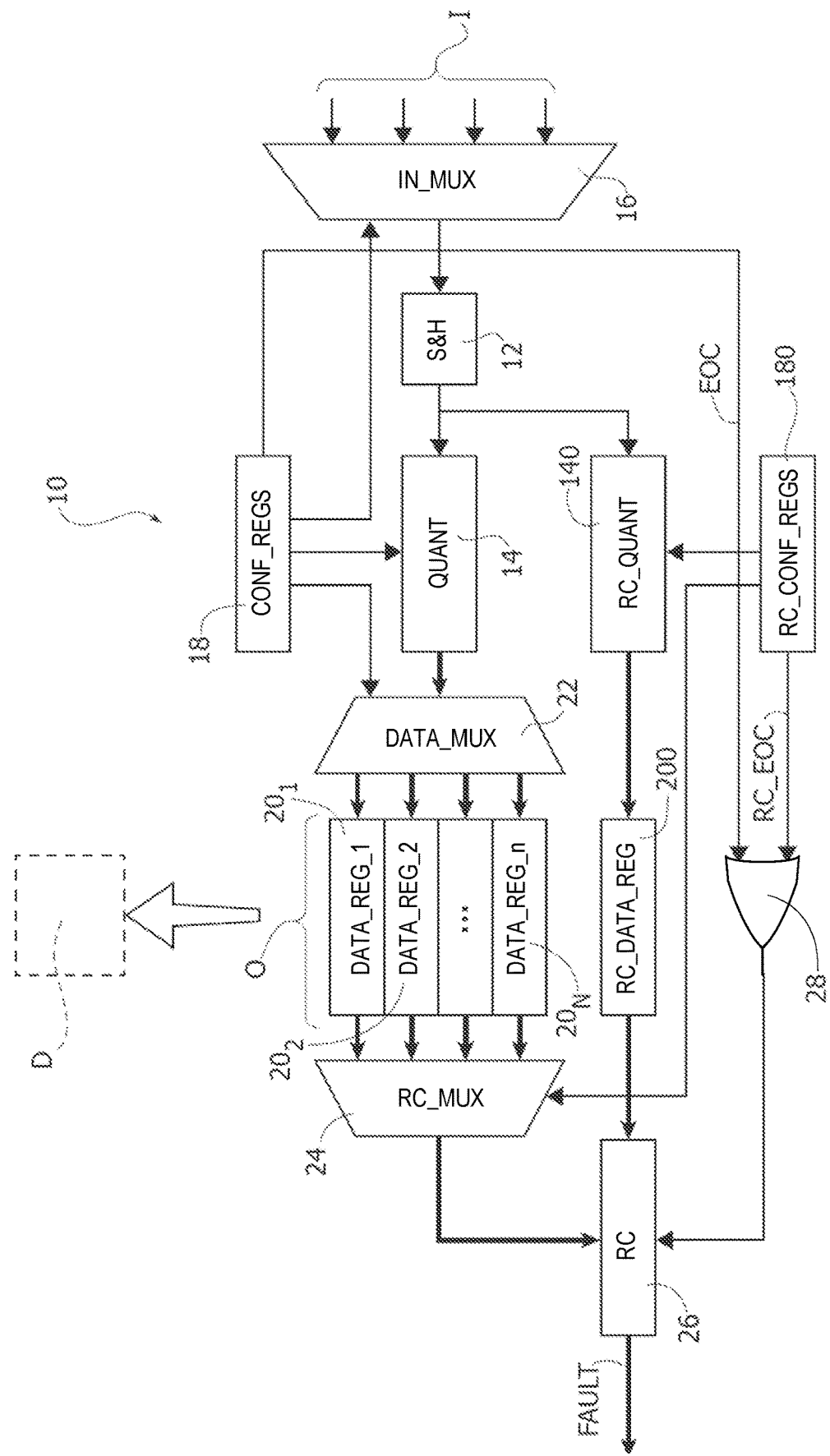
FIG. 2 is a block diagram exemplary of embodiments.

One or more embodiments may develop over such a circuit layout along the lines exemplified in the block diagram of FIG. 2.

In FIG. 2, parts or elements like parts or elements already discussed in connection with FIG. 1 are indicated with like references. While a corresponding description will not be repeated for brevity, it will be understood that the disclosure provided in connection with FIG. 1 applies to one or more embodiments.

In one or more embodiments as exemplified in FIG. 2, a further (redundancy) quantization circuit block 140 may be provided. Quantization circuit block 140 is configured to implement, in co-operation with the quantization circuit block 14, a parallel quantization process on the output value of the sampling circuit block 12.

The output from the quantization block 14 is stored in the respective channel data register $20_1, 20_2, \ldots, 20_N$, associated with the selected ADC channel and selected by the relevant configuration registers 18 via the multiplexer circuit block 22.

The output from the quantization block 140 is stored in a corresponding data register 200.

The values from the registers $20_1, 20_2, \ldots, 20_N$, (as selected via a (third) multiplexer circuit block 24 are compared in a (redundancy) checker circuit block (RC block) 26 for possible mismatch.

In one or more embodiments as exemplified herein, a failure can be declared (with a corresponding FAULT signal issued from the circuit block 26, for instance towards a device controller—not visible in the figure) if the following (mismatch) condition is verified:

$X_{DATA\_REG\_n}$ XOR $Y_{RC\_DATA\_REG}$>TUE [LSBs]

where:

$X_{DATA\_REG\_n}$ is the value stored in the n-th selected channel data register $20_1, 20_2, \ldots, 20_N$, selected via a (third) multiplexer circuit block 24, $Y_{RC\_DATA\_REG}$ is the value stored in the redundancy data register 200, TUE is a total unadjusted error, which may be expressed in units of Least Significant Bits (LSBs), and XOR denotes the exclusive-OR logical operator.

To some extent, the criteria for the exemplary match/mismatch comparison discussed herein may be regarded as a sort of "litmus test" performed on the basis of LSBs.

Such an approach, based on the TUE of the ADC converter, was found to be adequate for the purposes herein. It will be otherwise understood that one or more embodiments may adopt other criteria (for instance, various types of distance, Euclidean, SAD, and so on) for such an exemplary match/mismatch comparison.

In one or more embodiments as exemplified herein, the value to be compared at 26 with the value stored in the register 200 is selected via the multiplexer circuit block 24 under the control of a further set of configuration registers 18o with the aim of avoiding CCFs (Common Cause Faults).

Moreover, in one or more embodiments as exemplified herein, the comparison at 26 may be started at the end of conversion (EOC) of the quantization process (in the circuit block 14) or at the end of conversion (RC_EOC) of the redundant quantization process (in the circuit block 140), for instance at the one which occurs first.

Notionally, these two events should occur simultaneously. Either one occurring before the other may be indicative of the fact that one of the quantization circuit blocks is not performing correctly (at least, is not performing timely) its function. This may be due to an erroneous configuration. If this occurs, the data register of the "late" block is not updated with the correct conversion value and an error can be declared with the fault identified.

This starting point can be determined via an OR gate 28 active on a signal EOC from the set of registers 18 and a signal RC_EOC from the set of registers 180, which may also facilitate detecting deviations in time of the quantization process.

Notionally, the comparison at 26 may declare a failure after the end of each conversion while the data (i.e. the result of the conversions) are available in the ADC data register $20_1, 20_2, \ldots, 20_N$ and may be supplied to a "user" device D after the completion of a sequence of conversions.

Optionally, for instance in a case where the ADC data registers $20_1, 20_2, \ldots, 20_N$ may not guarantee the integrity of the data in the time between the end of comparisons and the time when these data are supplied to the "user" device D, the data from the register 200 can be stored in an FIFO protected via an error-correcting code (ECC-protected) in order to be supplied on request from the FIFO to the "user" device D.

As noted, one or more embodiments may facilitate detecting transient faults which may affect analog-to-digital converters with a diagnostic coverage extended in comparison with certain prior art solutions with just a moderate increase (for instance up to 15-20%) in terms of device size and, possibly cost, without appreciable impact on converter bandwidth, computational load and detection delay.

Table 4 which follows provides a summary of an estimated diagnostic coverage for the transient faults which may be provided by one or more embodiments portrayed in comparison with the two approaches discussed in the introduction of the detailed description of exemplary embodiments provided herein.

TABLE 4

Diagnostic coverage of transient failure modes

| Failure modes | Safety mechanism | Diagnostic coverage (Transient faults) |
|---|---|---|
| ADC converter deviation (value/time) | ADC_SWTEST_OVERSAMPLING ($1^{st}$ method) | 60% (1) |
| | ADC_SWTEST_CMP ($2^{nd}$ method) | 60% (1) |
| | Embodiments exemplified herein | 99% |
| ADC data register corrupted | ADC_SWTEST_OVERSAMPLING ($1^{st}$ method) | 99% |
| | ADC_SWTEST_CMP ($2^{nd}$ method) | 99% |
| | Embodiments exemplified herein | 99% |
| ADC configuration corrupted/wrong | ADC_SWTEST_OVERSAMPLING ($1^{st}$ method) | 66% (2) (3) |
| | ADC_SWTEST_CMP ($2^{nd}$ method) | 99% (2) |
| | Embodiments exemplified herein | 99% (2) |
| ADC wrong channel selection | ADC_SWTEST_OVERSAMPLING ($1^{st}$ method) | 99% |
| | ADC_SWTEST_CMP ($2^{nd}$ method) | 99% |
| | Embodiments exemplified herein | 99% |

(1) Not able to detect deviation in time
(2) Only effects of configuration corrupted/wrong on conversion result considered.
(3) Unable to detect faults affecting all conversions As exemplified herein, a circuit (such as, for instance, 10, which may be used for failure detection in analog-to-digital converters) may comprise:
- an analog-to-digital conversion circuit path (for instance, 12, 14, 18) configured to provide converted digital data (for instance, $20_1, 20_2, \ldots, 20_N$) from analog input signals (for instance, I),
- a further (redundancy) analog-to-digital conversion circuit path (for instance 12, 140, 180) configured to operate in parallel to the analog-to-digital conversion circuit path (at least partly: see, for instance, the quantization circuit stage 140 and the quantization circuit stage 14 both coupled to the common sampling circuit stage 12), the further analog-to-digital conversion circuit path configured to provide further converted digital data (for instance, 200) from the analog input signals,
- comparison circuitry (for instance, 26) configured to perform a comparison of the digital data from the analog-to-digital conversion circuit path with the further digital data (200) from the further analog-to-digital conversion circuit path and declare a fault condition of the circuit as a result of the comparison revealing a mismatch between the digital data from the analog-to-digital conversion circuit path and the further digital data from the further analog-to-digital conversion circuit path (12, 140, 180).

A circuit as exemplified herein may comprise a sampling circuit stage (for instance, 12) configured to receive analog input signals and provide a sampled version thereof, the sampling circuit stage common to (that is, shared by) the analog-to-digital conversion circuit path and the further analog-to-digital conversion circuit path,
wherein:
- the analog-to-digital conversion circuit path may comprise a quantization circuit stage (for instance, 14) coupled to the common sampling circuit stage and configured to provide the digital data from the sampled version of the analog input signals; and
- the further analog-to-digital conversion circuit path may comprise a further quantization circuit stage (for instance, 140) coupled to the common sampling circuit stage and configured to provide the further digital data from the sampled version of the analog input signals.

As exemplified herein:
- the analog-to-digital conversion circuit path may comprise a plurality of analog-to-digital conversion channels providing respective digital data,
- the comparison circuitry (for instance, 26) may be configured (for instance, 22, 24) to compare the respective digital data from the plurality of analog-to-digital conversion channels in the analog-to-digital conversion circuit path with the further digital data from the further analog-to-digital conversion circuit path and declare a fault condition of the circuit as a result of the comparison revealing a mismatch between the respective digital data from any of the analog-to-digital conversion channels out of the plurality of analog-to-digital conversion channels in the analog-to-digital conversion circuit path and the further digital data from the further analog-to-digital conversion circuit path.

A circuit as exemplified herein may comprise a multiplexer circuit block (for instance, 22) configured to distribute the respective digital data (as received, for instance, from the quantization circuit stage) over the plurality of analog-to-digital conversion channels.

A circuit as exemplified herein may comprise a plurality of registers configured to store respective digital data from the plurality of analog-to-digital conversion channels in the analog-to-digital conversion circuit path.

In a circuit as exemplified herein, the comparison circuitry may comprise a further multiplexer circuit block (for instance, 24) configured to retrieve from the plurality of registers respective digital data for comparison with the further digital data from the further analog-to-digital conversion circuit path.

In a circuit as exemplified herein, the further analog-to-digital conversion circuit path may be configured to provide error-correcting code protection of the further digital data from the further analog-to-digital conversion circuit path.

In a circuit as exemplified herein the comparison circuitry may be configured to reveal a mismatch between the digital data from the analog-to-digital conversion circuit path and the further digital data from the further analog-to-digital conversion circuit path as a result of the digital data from the analog-to-digital conversion circuit path and the further digital data from the further analog-to-digital conversion circuit path reaching a certain difference threshold, the difference threshold optionally including a number of least significant bits in the digital data and the further digital data.

In a circuit as exemplified herein, the comparison circuitry may be is configured (for instance, 28) to be activated to perform the comparison of the digital data from the analog-to-digital conversion circuit path with the further digital data from the further analog-to-digital conversion circuit path at the earlier of the completion (for instance, EOC) of analog-to-digital conversion in the analog-to-digital conversion circuit path and the completion of analog-to-digital conversion in the further analog-to-digital conversion circuit path.

A device (for instance, D) as exemplified herein, that is a device which may be coupled to and/or incorporate a circuit as exemplified herein may comprise, for instance, an electric motor control device, optionally for a brushless DC motor.

A method of operating a circuit as exemplified herein may comprise:
supplying analog input signals to the analog-to-digital conversion circuit path and the further analog-to-digital conversion circuit path,
collecting (for instance, at O) from the analog-to-digital conversion circuit path digital data resulting from conversion to digital of the analog input signals (I),
sensing at the comparison circuitry a fault signal (for instance, FAULT) indicative of a fault condition of the circuit declared as a result of the comparison revealing a mismatch between the digital data from the analog-to-digital conversion circuit path and the further digital data from the further analog-to-digital conversion circuit path.

Without prejudice to the underlying principles, the details and embodiments may vary, even significantly, with respect to what has been described by way of example only, without departing from the extent of protection.

The extent of protection is determined by the annexed claims.

What is claimed is:

1. A circuit comprising:
a first analog-to-digital conversion circuit path configured to provide first converted digital data from an analog input signal;
a second analog-to-digital conversion circuit path configured to provide second converted digital data from the analog input signal;
a sampling circuit stage configured to receive the analog input signal, sample and hold the analog input signal to generate a sampled version of the analog input signal, and provide the sampled version of the analog input signal, the sampling circuit stage being common to the first and second analog-to-digital conversion circuit paths; and
a comparison circuit configured to compare the first converted digital data with the second converter digital data and to generate a fault based on the comparison to reveal a mismatch between the first and second converted digital data.

2. The circuit of claim 1, wherein:
the first analog-to-digital conversion circuit path comprises a first quantization circuit stage coupled to the common sampling circuit stage, the first quantization circuit stage configured to provide the first converted digital data from the sampled version of the analog input signal; and
the second analog-to-digital conversion circuit path comprises a second quantization circuit stage coupled to the common sampling circuit stage, the second quantization circuit stage configured to provide the second converted digital data from the sampled version of the analog input signal.

3. The circuit of claim 1, wherein the first analog-to-digital conversion circuit path comprises a plurality of analog-to-digital conversion channels configured to provide respective digital data, and wherein the comparison circuit is configured to compare the respective digital data from the plurality of analog-to-digital conversion channels with the second converted digital data to generate the fault.

4. The circuit of claim 1, wherein the second analog-to-digital conversion circuit path is configured to provide error-correcting code protection of the second converted digital data.

5. The circuit of claim 1, wherein the comparison circuit is configured to reveal the mismatch between the first and second converted digital data when a difference between the first and second converted digital data is higher than a difference threshold.

6. The circuit of claim 1, wherein the comparison circuit is configured to be activated to perform the comparison at the earlier of a completion of an analog-to-digital conversion in the first analog-to-digital conversion circuit path and a completion of an analog-to-digital conversion in the second analog-to-digital conversion circuit path.

7. The circuit of claim 1, further comprising:
a first set of configuration registers configured to control the first analog-to-digital conversion circuit path; and
a second set of configuration registers configured to control the second analog-to-digital conversion circuit path, the second set of configuration registers being different from the first set of configuration registers.

8. The circuit of claim 3, further comprising a multiplexer configured to distribute the respective digital data over the plurality of analog-to-digital conversion channels.

9. The circuit of claim 3, further comprising a plurality of registers configured to store respective digital data from the plurality of analog-to-digital conversion channels.

10. The circuit of claim 5, wherein the difference threshold comprises a number of least significant bits in the first and second converted digital data.

11. The circuit of claim 9, wherein the comparison circuit comprises a multiplexer configured to retrieve from the plurality of registers respective digital data for comparison with the second converted digital data.

12. A method of operating an analog-to-digital converter circuit, the method comprising:
receiving an analog input signal with a sampling circuit that is common to first and second analog-to-digital conversion circuit paths;
sampling and holding the analog input signal using the sampling circuit to generate a sampled version of the analog input signal;
generating first converted digital data from the sampled version of the analog input signal using the first analog-to-digital conversion circuit path;
generating second converted digital data from the sampled version of the analog input signal using the second analog-to-digital conversion circuit path;
comparing the first and second converted digital data; and
generating a fault when the comparison reveals a mismatch between the first and second converted digital data.

13. The method of claim 12, further comprising:
storing the first converted digital data in a register; and
reading from the register the first converted digital data, wherein comparing the first and second converted digital data comprises comparing the first converted digital data read from the register to the second converted digital data.

14. The method of claim 12, further comprising performing the comparison at the earlier of a completion of an analog-to-digital conversion in the first analog-to-digital conversion circuit path and a completion of an analog-to-digital conversion in the second analog-to-digital conversion circuit path.

15. The method of claim 12, wherein providing the first converted digital data comprises providing the first converted digital data to an electric motor control device.

16. The method of claim 15, wherein the electric motor control device is a brushless DC motor control device.

17. A circuit comprising:
a sample and hold circuit configured to receive an analog input signal and sample and hold the analog input signal to produce a sampled version of the analog input signal;
a first quantization circuit coupled to an output of the sample and hold circuit and configured to provide first converted digital data from the sampled version of the analog input signal;
a second quantization circuit coupled to the output of the sample and hold circuit and configured to provide second converted digital data from the sampled version of the analog input signal; and
a comparison circuit configured to compare the first and second converted digital data and generate a fault based on the comparison to reveal a mismatch between the first and second converted digital data.

18. The circuit of claim 17, further comprising:
a plurality of registers coupled to an output of the first quantization circuit; and
a multiplexer having inputs coupled to the plurality of registers and having an output coupled to the comparison circuit, wherein the comparison circuit is configured to receive the first converted digital data from the output of the multiplexer.

19. The circuit of claim 17, wherein the circuit is configured to be coupled to an electric brushless DC motor control device.

20. The circuit of claim 18, further comprising:
one or more first configuration registers coupled to the first quantization circuit; and
one or more second configuration registers coupled to the second quantization circuit and to the multiplexer, wherein the one or more second configuration registers are configured to select an input of the multiplexer.

21. The circuit of claim 20, further comprising an OR gate having a first input coupled to the one or more first configuration registers and a second input coupled to the one or more second configuration registers, wherein the comparison circuit comprises an activation input coupled to an output of the OR gate.

* * * * *